United States Patent
Chen et al.

(10) Patent No.: US 11,044,818 B1
(45) Date of Patent: Jun. 22, 2021

(54) METHOD FOR BONDING PLASTIC COMPONENT TO PRINTED CIRCUIT BOARD

(71) Applicant: FORWARD OPTICS CO., LTD., Taichung (TW)

(72) Inventors: Juei-Pin Chen, Taichung (TW); Huai-An Wu, Taichung (TW); Wei Shen, Taichung (TW)

(73) Assignee: Forward Optics Co., Ltd., Taichung (TW)

( * ) Notice: Subject to any disclaimer, the term of this patent is extended or adjusted under 35 U.S.C. 154(b) by 0 days.

(21) Appl. No.: 16/869,985

(22) Filed: May 8, 2020

(30) Foreign Application Priority Data

Jan. 2, 2020 (TW) ................................ 109100083

(51) Int. Cl.
*H05K 3/34* (2006.01)
*H05K 3/22* (2006.01)

(52) U.S. Cl.
CPC ....... *H05K 3/22* (2013.01); *H05K 2203/1121* (2013.01); *H05K 2203/166* (2013.01)

(58) Field of Classification Search
CPC ............... H05K 3/22; H05K 2203/166; H05K 2203/1121; Y10T 29/4913; Y10T 29/49133; Y10T 29/49144
USPC .................................. 29/832, 834, 837, 840
See application file for complete search history.

(56) References Cited

U.S. PATENT DOCUMENTS

| | | | | |
|---|---|---|---|---|
| 2,651,833 | A * | 9/1953 | Kernahan | H05K 3/326 29/837 |
| 5,641,291 | A * | 6/1997 | Sueki | H01R 12/57 439/83 |
| 10,405,434 | B2 * | 9/2019 | Maruyama | H05K 3/341 |

* cited by examiner

*Primary Examiner* — Donghai D Nguyen
(74) *Attorney, Agent, or Firm* — Rosenberg, Klein & Lee

(57) ABSTRACT

A method for bonding a plastic component to a printed circuit board includes the steps of: a) providing the plastic component, the printed circuit board, and at least one positioning member, b) disposing at least one welding layer, c) positioning the plastic component and the printed circuit board relative to each other, d) melting the at least one welding layer while the plastic component is maintained in a positioning position, and e) cooling the at least one welding layer while the plastic component is maintained in the positioning position.

11 Claims, 5 Drawing Sheets

METHOD FOR BONDING PLASTIC COMPONENT TO PRINTED CIRCUIT BOARD

CROSS-REFERENCE TO RELATED APPLICATION

This application claims priority of Taiwanese Invention Parent application No. 109100083, filed on Jan. 2, 2020.

FIELD

The disclosure relates to a method for bonding a plastic component to a printed circuit board, and more particularly to a method for bonding a plastic component to a printed circuit board in an optical system.

BACKGROUND

Recently, there is a tendency for increasing the running frequency of optical communication module due to increased demand for data traffic, such that the volume and the work surface of relevant components are decreased gradually. Therefore, the positioning relationship among the components needs to be more precise, so as to reduce the loss of the laser light transmitting among the components and to maintain sufficient energy for message transmission.

A conventional optical communication module includes a light-guiding plastic component and a printed circuit board, which have to be bonded to each other and satisfy a very precise positioning relationship to as to perform the originally designed functions. A conventional method for bonding the plastic component to the printed circuit board is conducted using an ultraviolet (UV) glue. Specifically, the relative position between the plastic component and the printed circuit board is adjusted precisely, and the transmission power of the laser light during the adjustment is monitored at the same time. When satisfactory conditions are achieved, the UV glue is added between the plastic component and the printed circuit board, followed by curing the UV glue via irradiation of UV light so as to complete the bonding process. However, the UV light is easily blocked by the plastic component and the printed circuit board, causing insufficient irradiation energy for fully curing the UV glue. In addition, when the UV glue is relatively thick, the deeper portion of the UV glue would not be cured completely due to the irradiation strength of the UV light being decreased gradually along a thickness direction of the UV glue. The incompletely cured port ion of the UV glue would not be able to perform the curing function, or would only cure gradually after the bonding process is finished, causing changes in the volume of the UV glue and the relative position between the plastic component and the printed circuit board, which results in degradation of the functions thereof. Although the aforesaid disadvantages can be solved by increasing the preciseness of the relative position and the time period for UV irradiation, the complexity and the operation time for assembling the plastic component and the printed circuit board would be increased.

Another conventional method for bonding the plastic component to the printed circuit board is conducted using a thermal curing adhesive, which can avoid the aforesaid blocking problem caused by using the UV glue. However, after the thermal curing adhesive is applied, the plastic component and the printed circuit board together with the thermal curing adhesive applied therebetween are required to be placed in an elevated temperature environment for curing the thermal curing adhesive. The density variation of the thermal curing adhesive is relatively significant during the curing process compared to that of the UV glue, resulting in a relatively significant volume variation. In addition, during the curing process conducted at the elevated temperature, the relative position between the plastic component and the printed circuit board would be changed, resulting in degradation of the functions thereof.

In addition, the performance of both the UV glue and the thermal curing adhesive that are made of polymeric material is easily affected by environmental factors. For example, the water contents of the UV glue and the thermal curing adhesive are increased after absorption of moisture in the air, causing variation in the volumes of the UV glue and the thermal curing adhesive. Furthermore, the UV glue and the thermal curing adhesive would degrade easily due to severe temperature variation, resulting in reduction of the bonding capability thereof, and thus, the functions and reliability of the products made thereby would be reduced compared to those of the originally designed products.

SUMMARY

Therefore, an object of the disclosure is to provide a method for bonding a plastic component to a printed circuit board to overcome the shortcomings described above.

According to the disclosure, there is provided a method for bonding a plastic component to a printed circuit board, which includes the steps of:

a) providing the plastic component, the printed circuit board, and at least one positioning member, wherein
   the plastic component includes a first end surface, which faces the printed circuit board when the plastic component is disposed above the printed circuit board, and at least one fastening hole formed in the first end surface,
   the printed circuit board includes a substrate, and at least one metal base which is disposed on the substrate and which has a connecting surface connected to the substrate and a first bonding surface opposite to the connecting surface, and
   the at least one positioning member is fastened in the at least one fastening hole and is made of a metal material, and includes a second bonding surface exposed from the first end surface;

b) disposing between the first bonding surface of the at least one metal base of the printed circuit board and the second bonding surface of the at least one positioning member, at least one welding layer made of a welding metal, which has a melting point lower than a thermal deformation temperature of the plastic component and which is solid at a predetermined temperature range;

c) positioning the plastic component and the printed circuit board relative to each other, such that the plastic component is in a positioning position relative to the printed circuit board;

d) melting the at least one welding layer using a heating device while the plastic component is maintained in the positioning position, so as to permit the first bonding surface of the at least one metal base of the printed circuit board to adhere to the second bonding surface of the at least one positioning member via the at least one welding layer; and e) cooling the at least one welding layer while the the plastic component is maintained in the positioning position so as to solidify the at least one welding layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
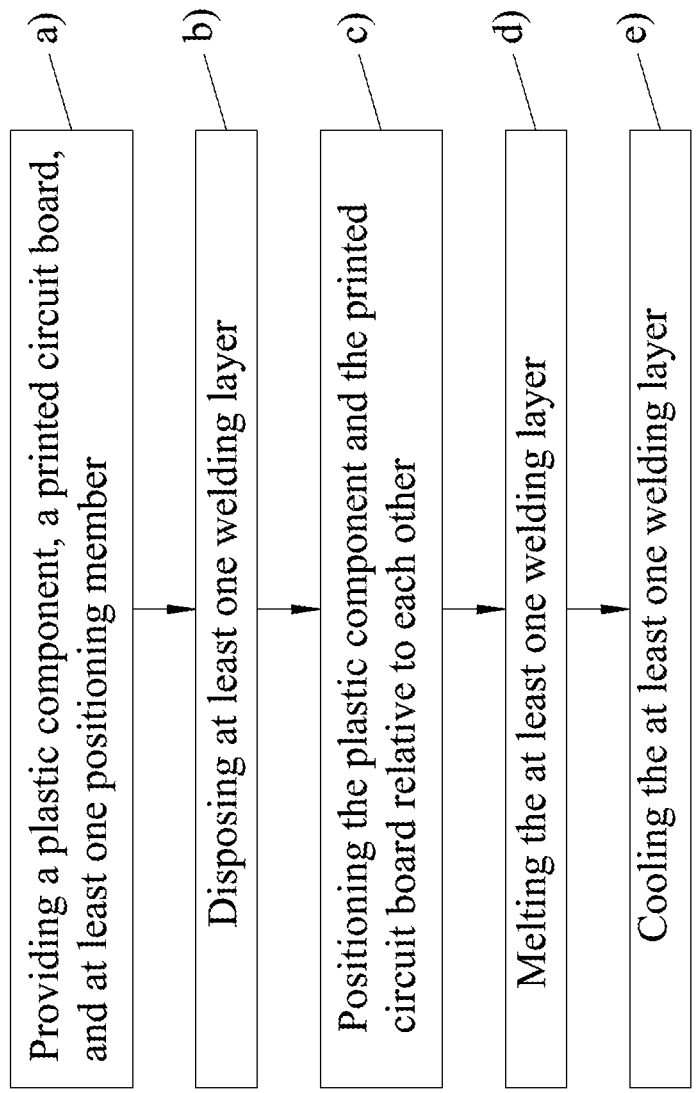
FIG. 1 is a flow diagram of a method for bonding a plastic component to a printed circuit board according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
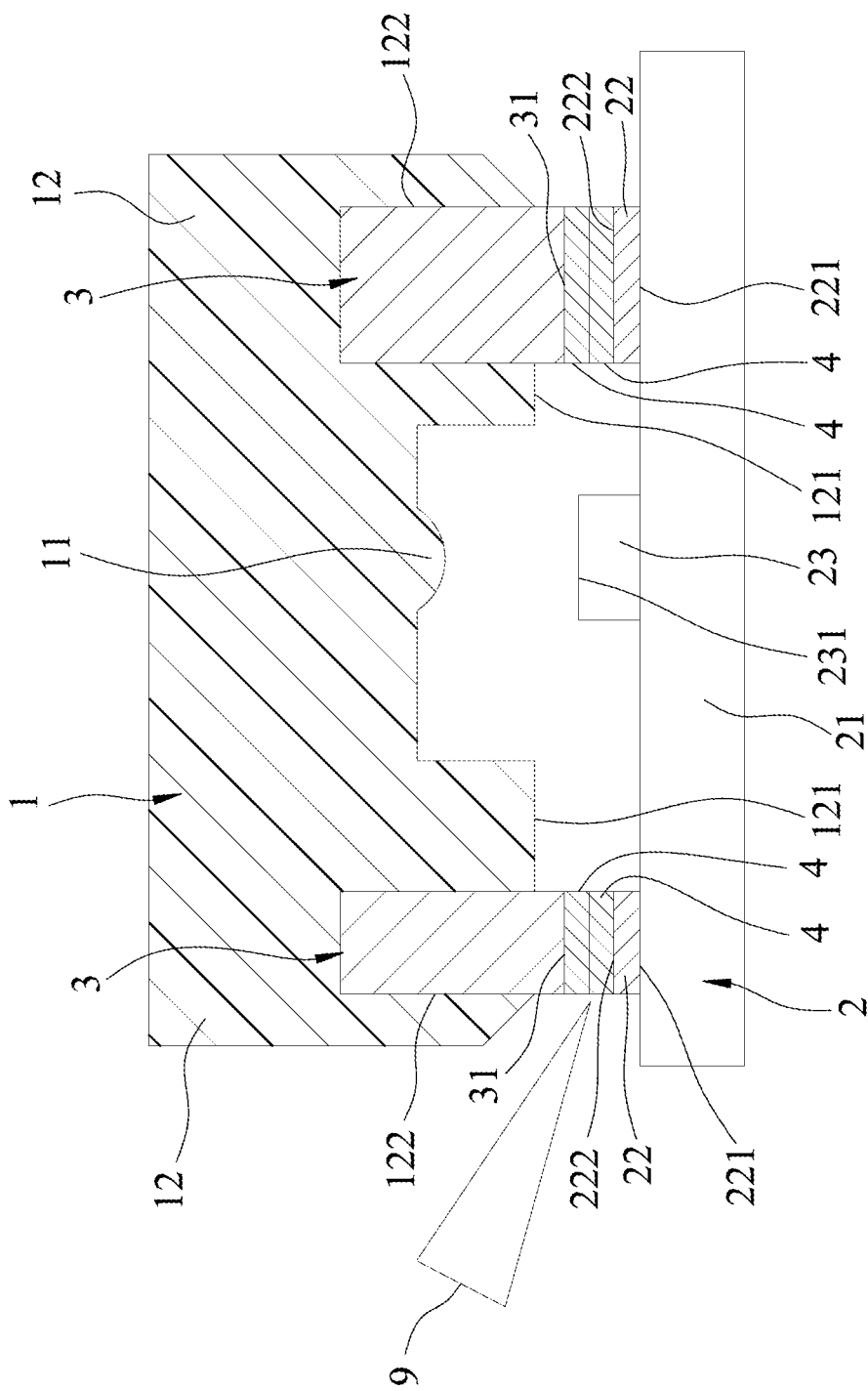
FIG. 2 is a schematic view illustrating a first embodiment of the method for bonding a plastic component to a printed circuit board according to the disclosure.

Referring to FIGS. 1 and 2, a first embodiment of a method for bonding a plastic component 1 to a printed circuit board 2 includes the steps of: a) providing the plastic component 1, the printed circuit board 2, and at least one positioning member 3, b) disposing at least one welding layer 4, c) positioning the plastic component 1 and the printed circuit board 2 relative to each other, d) melting the at least one welding layer 4, and e) cooling the at least one welding layer 4.

In step a), the plastic component 1, the printed circuit board 2, and the at least one positioning member 3 are provided.

The plastic component 1 includes a first end surface 121 and at least one fastening hole 122 formed in the first end surface 121. The first end surface 121 faces the printed circuit board 2 when the plastic component 1 is disposed above the printed circuit board 2. Two fastening holes 122 are shown in FIG. 2. It should be noted that the number of the fastening hole 122 is not limited, which may be more than two. In addition, the plastic component 1 includes a first positioning portion 11 and at least one fastening portion 12. The first positioning portion 11 is configured as a lens. Two fastening portions 12 are shown in FIG. 2. It should be noted that the number of the fastening portion 12 is not limited, which may be more than two. Each of the fastening portions 12 is formed with a corresponding one of the fastening holes 122.

The printed circuit board 2 includes a substrate 21, an electronic element 23, and at least one metal base 22 disposed on the substrate 21. Two metal bases 22 are shown in FIG. 2. It should be noted that the number of the metal base 22 is not limited, which may be more than two. Each of the metal bases 22 has a connecting surface 221 connected to the substrate 21, and a first bonding surface 222 opposite to the connecting surface 221. The electronic element 23 is disposed on the substrate 21 and has a second positioning portion 231.

The at least one positioning member 3 is fastened in the at least one fastening hole 122 and is made of a metal material. In this embodiment, the at least one positioning member 3 is fitted in the at least one fastening hole 122, respectively. Specifically, two positioning members 3 are shown in FIG. 2. It should be noted that the number of the positioning member 3 is not limited, which may be more than two. Each of the positioning members 3 is fitted in a corresponding one of the fastening holes 122, and includes a second bonding surface 31 exposed from the first end surface 121.

It should be noted that the number of the first positioning portion 11 and the corresponding number of the second positioning portion 231 may be increased for the intended functions, if necessary. Each of the positioning members 3 is illustrated as a metal block in the embodiment. It should be noted that the positioning member 3 may be a metal sheet, a metal strip, or other structures.

In step b), at least one welding layer 4 is disposed between the first bonding surface 222 of each of the metal bases 22 of the printed circuit board 2 and the second bonding surface 31 of a corresponding one of the positioning members 3. In this embodiment, two welding layers 4 are disposed between the first bonding surface 222 of each of the metal bases 22 and the second bonding surface 31 of a corresponding one of the positioning members 3. Each of the first bonding surface 222 of the at least one metal base 22 and the second bonding surface 31 of the at least one positioning member 3 is disposed with the welding layer 4. In other words, the first bonding surface 222 of each of the metal bases 22 is disposed with one of the welding layers 4 thereon, and the second bonding surface 31 of each of the positioning members 3 is disposed with the other one of the welding layers 4 thereon.

It should be noted that in step b), when only one welding layer 4 is disposed between the first bonding surface 222 of each of the metal bases 22 and the second bonding surface 31 of a corresponding one of the positioning members 3, the welding layer 4 may be disposed on the first bonding surface 222 or the second bonding surface 31.

The welding layer 4 is made of a welding metal, which has a melting point lower than a thermal deformation temperature of the plastic component 1 and which is solid at a predetermined temperature range that includes room temperature (usually 25° C.)

It should be noted that the predetermined temperature range is determined on a basis of the product to be processed and operated. In certain embodiments, the predetermined temperature range is from −20° C. to 200° C., and the melting point of the welding metal should be higher than 200° C.

In step c), the plastic component 1 and the printed circuit board 2 are positioned relative to each other, such that the plastic component 1 is in a positioning position relative to the printed circuit board 2. When the plastic component 1 is in the positioning position, the first positioning portion 11 of the plastic component 1 is aligned with the second positioning portion 231 of the electronic element 23, and the first bonding surface 222 of each of the metal bases 22 of the printed circuit board 2 is aligned with the second bonding surface 31 a corresponding one of the positioning members 3, so as to permit the welding layers 4 to be sandwiched between the first bonding surface 222 and the second bonding surface 31.

In step d), the welding layers 4 are molted using a heating device 9 while the plastic component 1 is maintained in the positioning position, so as to permit the first bonding surface 222 of each of the metal bases 22 of the printed circuit board 2 to adhere to the second bonding surface 31 of a corresponding one of the positioning members 3 via the welding layers 4. Specifically, the welding layer 4 disposed on the first bonding surface 222 of the at least one metal base 22 and the welding layer 4 disposed on the second bonding surface 31 of the at least one positioning member 3 are molten so as to be welded together. The heating device 9 used in the embodiment is a laser-emitting device. The thermal energy produced by the laser-emitting device is transmitted to the welding layers 4 via thermal radiation. It should be noted that the thermal energy produced by the heating device 9 may be transmitted via the other manners depending on the type of the heating device 9, such as via thermal convection or thermal conduction.

Since the positioning members 3 are made of a metal material, the welding layer 4 made of a welding metal may be adhered to the second bonding surface 31 thereof without the problem caused by bonding a metal material to a non-metal material.

In step e), the welding layers 4 are cooled while the plastic component 1 is maintained in the positioning position so as to solidify the welding layers 4.

Since the welding metal for the welding layer 4 has superior thermal conductivity, the welding layer 4 can be heated and cooled in a fast and evenly manner. Therefore, the aforesaid incomplete curing problem of the prior art can be avoided, and the operation time for bonding the plastic component 1 to the printed circuit board 2 can be decreased. In addition, the welding metal has a relatively low density variation caused by the temperature change as compared to that of the polymeric material. Therefore, the volume of the the welding layer 4 can be maintained substantially constant during the bonding of the plastic component 1 to the printed circuit board 2. Furthermore, since the welding metal is substantially not affected by moisture, the functional degradation problem of the prior art can be overcome. In view of the aforesaid, the positioning relationship between the plastic component 1 and the printed circuit board 2 will not be affected by the welding layer 4, and thus, the preciseness in positioning and the reliability of the product made thereby can be enhanced significantly.

Figure 3:
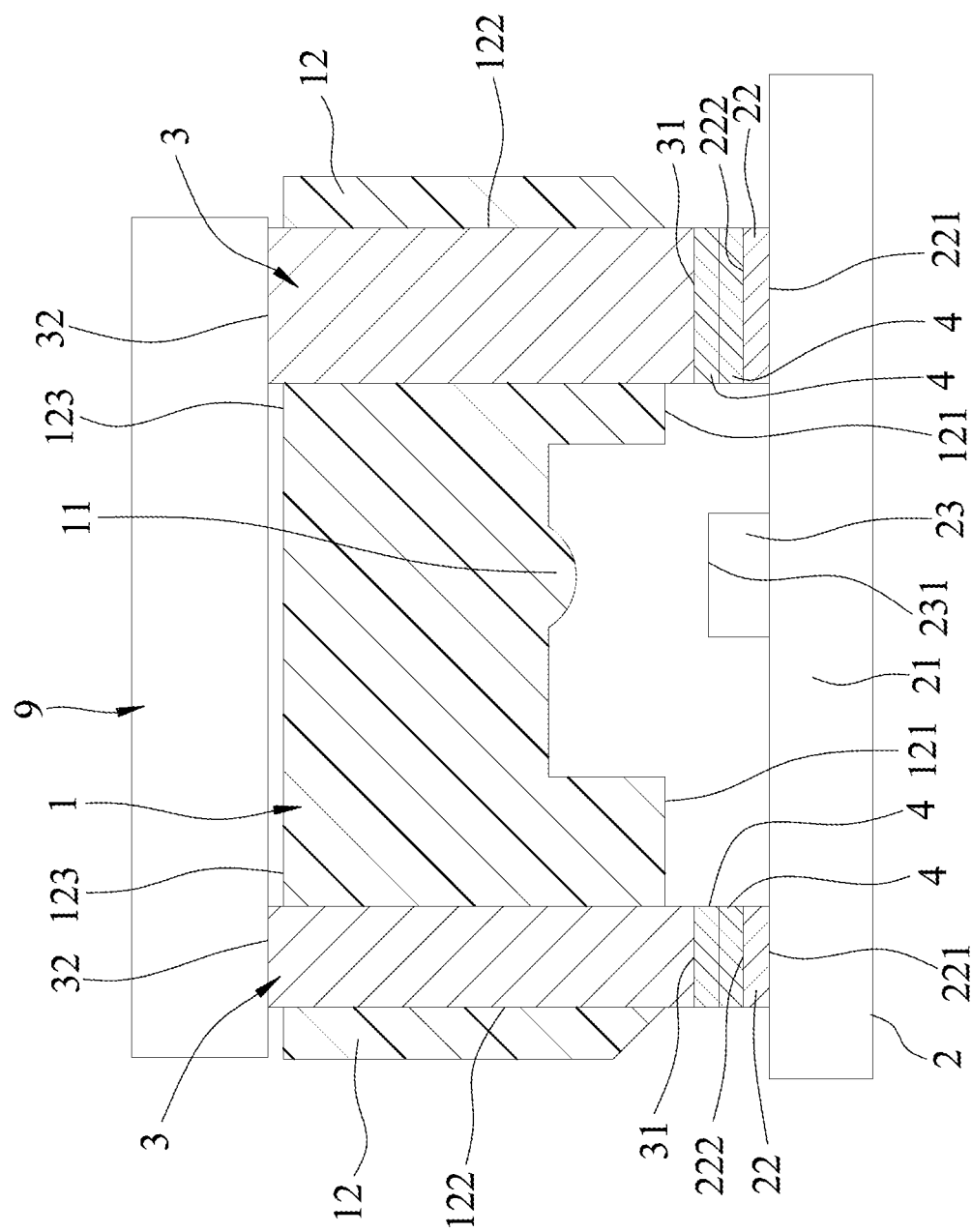
FIG. 3 is a schematic view illustrating a second embodiment of the method for bonding a plastic component to a printed circuit board according to the disclosure.

Referring to FIG. 3, a second embodiment of the method for bonding a plastic component 1 to a printed circuit board 2 is similar to the first embodiment except the following differences.

In step a) of the second embodiment, the plastic component 1 is formed integrally with the at least one positioning member 3 via molding, and further includes a second end surface 123 opposite to the first end surface 121. The at least one fastening hole 122 extends from the first end surface 121 to the second end surface 123. The at least one positioning member 3 extends through the at least one fastening hole 122 to terminate at a thermal conductive surface 32 that is exposed from the second end surface 123.

In step d) of the second embodiment, the heating device 9 is disposed on the thermal conductive surface 32 of the at least one positioning member 3 so as to transmit heat from the thermal conductive surface 32 to the at least one welding layer 4 via thermal conduction.

Figure 4:
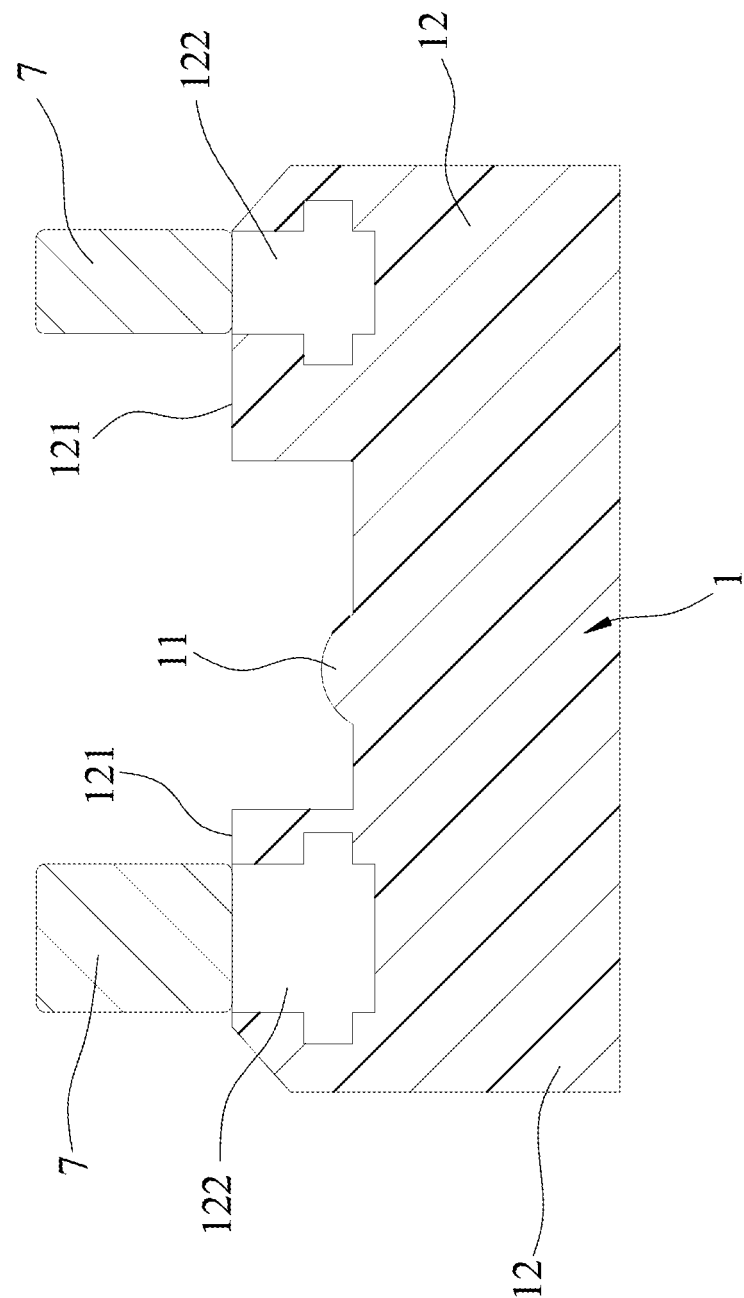
FIGS. 4 and 5 are schematic views illustrating a third embodiment of the method for bonding a plastic component to a printed circuit board according to the disclosure.
Figure 5:
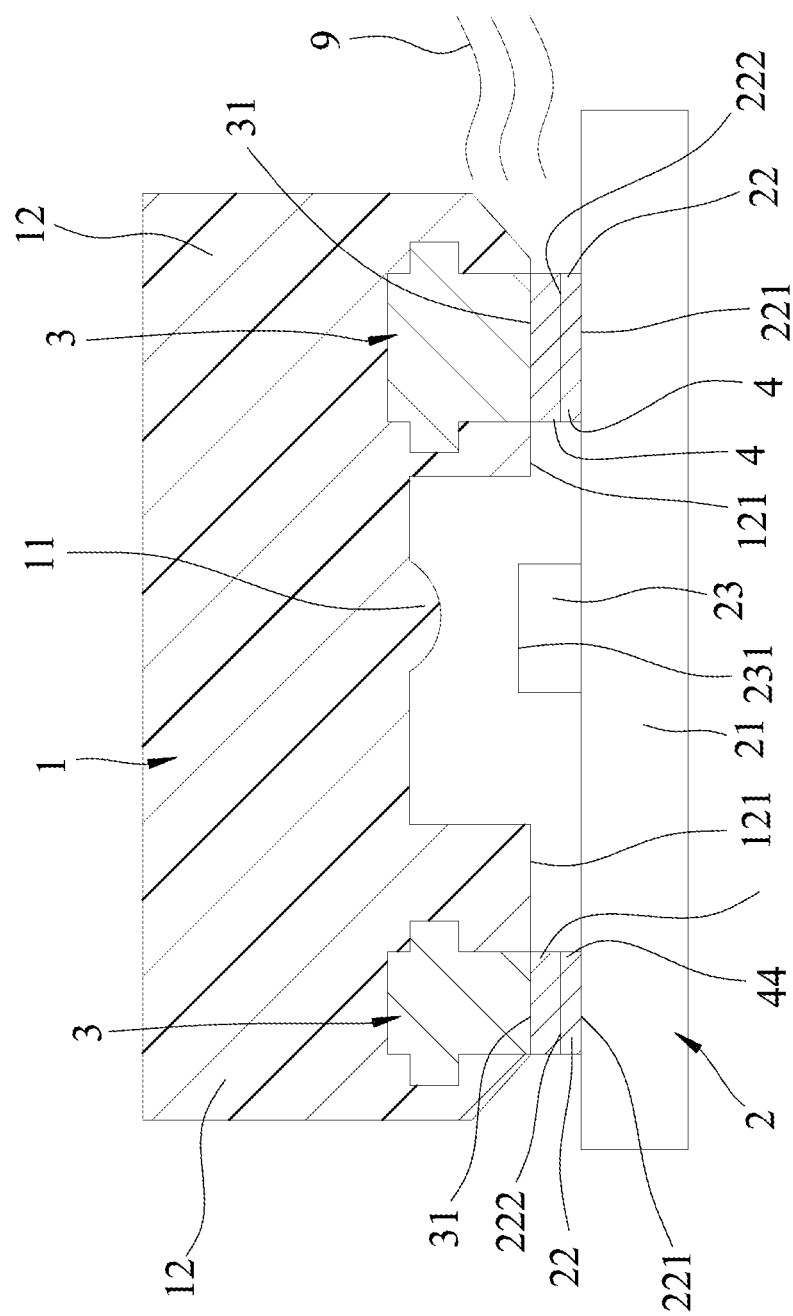

Referring to FIGS. 4 and 5, a third embodiment of the method for bonding a plastic component 1 to a printed circuit board 2 is similar to the first embodiment except the following differences.

In step a) of the third embodiment, the at least one positioning member 3 is made of the welding metal 7, and is fastened in the at least one fastening hole 122. To be specific, the welding metal 7 is molten to form a molten welding metal so as to permit the molten welding metal to fill in the at least one fastening hole 122 and then the molten welding metal is solidified via cooling to form the at least one positioning member 3 fastened in the at least one fastening hole 122.

In step d) of the third embodiment, the heating device 9 is a hot air generator, and the at least one welding layer 4 is molten by the hot air generated by the hot air generator via thermal convection.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for bonding a plastic component to a printed circuit board, comprising the steps of:
   a) providing the plastic component, the printed circuit board, and at least one positioning member, wherein
      the plastic component includes a first end surface, which faces the printed circuit board when the plastic component is disposed above the printed circuit board, and at least one fastening hole formed in the first end surface,
      the printed circuit board includes a substrate, and at least one metal base which is disposed on the substrate and which has a connecting surface connected to the substrate and a first bonding surface opposite to the connecting surface, and
      the at least one positioning member is fastened in the at least one fastening hole and is made of a metal material, and includes a second bonding surface exposed from the first end surface;
   b) disposing between the first bonding surface of the at least one metal base of the printed circuit board and the second bonding surface of the at least one positioning member, at least one welding layer made of a welding metal, which has a melting point lower than a thermal deformation temperature of the plastic component and which is solid at a predetermined temperature range;
   c) positioning the plastic component and the printed circuit board relative to each other, such that the plastic component is in a positioning position relative to the printed circuit board;
   d) melting the at least one welding layer using a heating device while the plastic component is maintained in the positioning position, so as to permit the first bonding surface of the at least one metal base of the printed circuit board to adhere to the second bonding surface of the at least one positioning member via the at least one welding layer; and e) cooling the at least one welding layer while the plastic component is maintained in the positioning position so as to solidify the at least one welding layer.

2. The method according to claim 1, wherein in step a), the plastic component includes a first positioning portion and at least one fastening portion, which is formed with the at least one fastening hole, and the printed circuit board further includes an electronic element disposed on the substrate and having a second positioning portion, and in step c), when the plastic component is in the positioning position, the first positioning portion of the plastic component is aligned with the second positioning portion of the electronic element, and the first bonding surface of the at least one metal base of the printed circuit board is aligned with the second bonding surface of the at least one positioning member, so as to permit the at least one welding layer to be sandwiched between the first bonding surface and the second bonding surface.

3. The method according to claim 2, wherein in step a), the first positioning portion is configured as a lens.

4. The method according to claim 1, wherein in step a), the at least one positioning member is fitted in the at least one fastening hole, respectively.

5. The method according to claim 1, wherein in step a), the plastic component further includes a second end surface opposite to the first end surface, the at least one fastening hole extends from the first end surface to the second end surface, and the at least one positioning member extends through the at least one fastening hole to terminate at a thermal conductive surface that is exposed from the second end surface, and in step d), the heating device is disposed on the thermal conductive surface of the at least one positioning member so as to transmit heat from the thermal conductive surface to the at least one welding layer.

6. The method according to claim 5, wherein in step a), the plastic component includes a first positioning portion and at least one fastening portion which is formed with the at least one fastening hole.

7. The method according to claim 1, wherein in step a), the plastic component is formed integrally with the at least one positioning member via molding.

8. The method according to claim 1, wherein in step a), the at least one positioning member is made of the welding metal.

9. The method according to claims, wherein in step a), the at least one positioning member is made of the welding metal and is fastened in the at least one fastening hole by melting the welding metal to form a molten welding metal so as to permit the molten welding metal to fill in the at least one fastening hole and then solidifying the molten welding metal via cooling.

10. The method according to claim 1, wherein in step b), each of the first bonding surface of the at least one metal base and the second bonding surface of the at least one positioning member is disposed with the welding layer, and in step d), the welding layer disposed on the first bonding surface of the at least one metal base and the welding layer disposed on the second bonding surface of the at least one positioning member are molten so as to welded together.

11. The method according to claim 1, wherein in step b), the predetermined temperature range is from −20° C. to 200° C.

* * * * *